(12) United States Patent
Lu et al.

(10) Patent No.: US 6,186,816 B1
(45) Date of Patent: Feb. 13, 2001

(54) ELECTRICAL CONNECTOR

(75) Inventors: Sidney Lu, Honolulu, HI (US); Wen-Chun Pei; Ming-Lun Szu, both of Taipei (TW)

(73) Assignee: Hon Hai Precision Ind. Co., Ltd., Taipei Hsien (TW)

( * ) Notice: Under 35 U.S.C. 154(b), the term of this patent shall be extended for 0 days.

(21) Appl. No.: 09/399,136

(22) Filed: Sep. 20, 1999

(30) Foreign Application Priority Data

Dec. 18, 1998 (TW) .................................................. 87221147

(51) Int. Cl.⁷ .................................................. H01R 13/62
(52) U.S. Cl. .............................................. 439/342; 439/83
(58) Field of Search ............................. 439/342, 83, 381, 439/71, 79

(56) References Cited

U.S. PATENT DOCUMENTS 5,046,957 * 9/1991 Millhimes .............................. 439/83
5,685,725 * 11/1997 Uratsuji .................................. 439/71
5,947,778 * 9/1999 Lai et al. ............................. 439/342

* cited by examiner

*Primary Examiner*—Gary F. Paumen
(74) *Attorney, Agent, or Firm*—Wei Te Chung

(57) ABSTRACT

An electrical connector for electrically connecting a chip module to a circuit board comprises a dielectric base, a dielectric cover, a number of contacts and a positioning member. Each contact comprises a contact portion received in the base and a joining portion extending into the positioning member. The positioning member has a number of guiding holes and a number of conical receiving recesses having solder balls deposited therein. The guiding holes of the positioning member snugly receive the joining portions of the corresponding contacts thereby preventing molten solder from flowing into the base. The positioning member may be made of the same dielectric material as the mating circuit board thereby eliminating different thermal expansion between top and bottom surfaces of the solder balls due to a difference in coefficients of thermal expansion between the electrical connector and the mating circuit board.

4 Claims, 5 Drawing Sheets

ELECTRICAL CONNECTOR

BACKGROUND OF THE INVENTION

The present invention relates to an electrical connector for electrically connecting a chip module to a mating circuit board, and particularly to an electrical connector having a positioning member for receiving and positioning solder balls therein and for preventing molten solder from flowing into a housing of the connector.

As technology rapidly develops, electronic components which are constructed with a high degree of precision and stricter requirements are placed upon electrical connectors used with such electronic components. A connector is designed not only to fulfil functional requirements but also to facilitate manufacture thereof. Pertinent conventional connectors are disclosed in U.S. Pat. No. 5,685,725 and Taiwan Patent Application Nos. 81214806, 85209165 and 86102563.

Referring to FIGS. 1 and 2, a conventional electrical connector for electrically connecting a chip module to a mating circuit board comprises a dielectric base 1', a plurality of contacts 3' (amplified in FIG. 1) and a dielectric cover (not labeled). The base 1' comprises a mounting surface 11', a joining surface 10' opposite the mounting surface 11', and a plurality of contact receiving passageways 12' for receiving the corresponding contacts 3' therein. Each contact 3' comprises a contacting portion 33', an engaging portion 31', a resilient portion 32' and a joining portion 30'. The engaging portions 31' are interferentially engaged within the corresponding contact receiving passageways 12'. The resilient portions 32' and the contacting portions 33' are laterally deflected and the contacting portions 33' electrically contact with corresponding terminals of a mating connector. However, since the contacts 3' are inserted into the corresponding passageways 12' from the joining surface 10' of the base 1', gaps are defined between inner side walls of the passageways 12 and the contacts 3'. The gaps allow solder to flow into the passageways 12' thereby decreasing the quality of signal transmission between the connector and the mating circuit board.

BRIEF SUMMARY OF THE INVENTION

A main object of the present invention is to provide an electrical connector having a positioning member receiving and positioning solder balls therein and preventing molten solder from flowing into a dielectric housing of the connector thereby ensuring a high quality of signal transmission between the connector and a mating circuit board.

Another object of the present invention is to provide an electrical connector having a positioning member attached to a dielectric base, for precisely positioning solder balls attached on the positioning member and contacts of the connector thereby achieving proper connections with a mating circuit board.

In accordance with one aspect of the present invention, an electrical connector is provided for electrically connecting a chip module to a circuit substrate. The electrical connector comprises a dielectric base, a plurality of contacts received in the base and a positioning member in the form of a positioning board. The base comprises a mating surface for supporting a chip module, a joining surface for mating with the positioning board and a plurality of engaging slots defined between the mating surface and the joining surface for receiving the corresponding contacts therein. The positioning board is mounted to the joining surface of the base and comprises a guiding means. The guiding member can be a plurality of guiding holes for guiding distal portions of the corresponding contacts extending therethrough. A bottom surface of the positioning board forms a receiving means in compliance with configurations of solder balls disposed therein. The receiving means can be a plurality of recesses joined with the corresponding guiding holes. The guiding holes cooperate with the receiving recesses to prevent molten solder from flowing into the engaging slots of the base. Thus, the connector provides an excellent quality of signal transmission between the chip module and the mating circuit board.

Other objects, advantages and novel features of the invention will become more apparent from the following detailed description when taken in conjunction with the accompanying drawings.

DETAILED DESCRIPTION OF THE INVENTION

Figure 1:
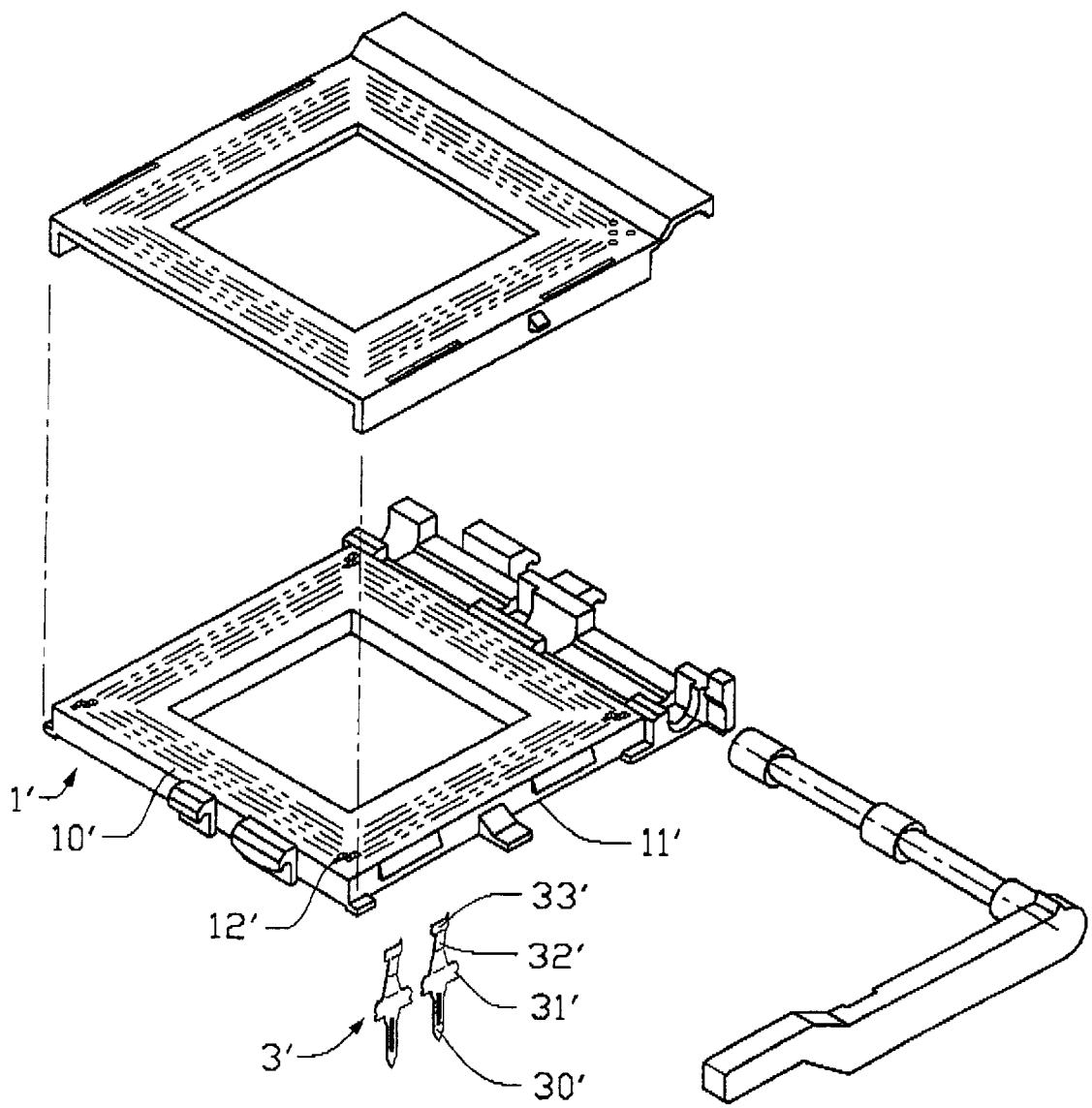
FIG. 1 is an exploded view of a conventional electrical connector in which the exemplary contacts are exaggerated in size for clarity purpose.
Figure 2:
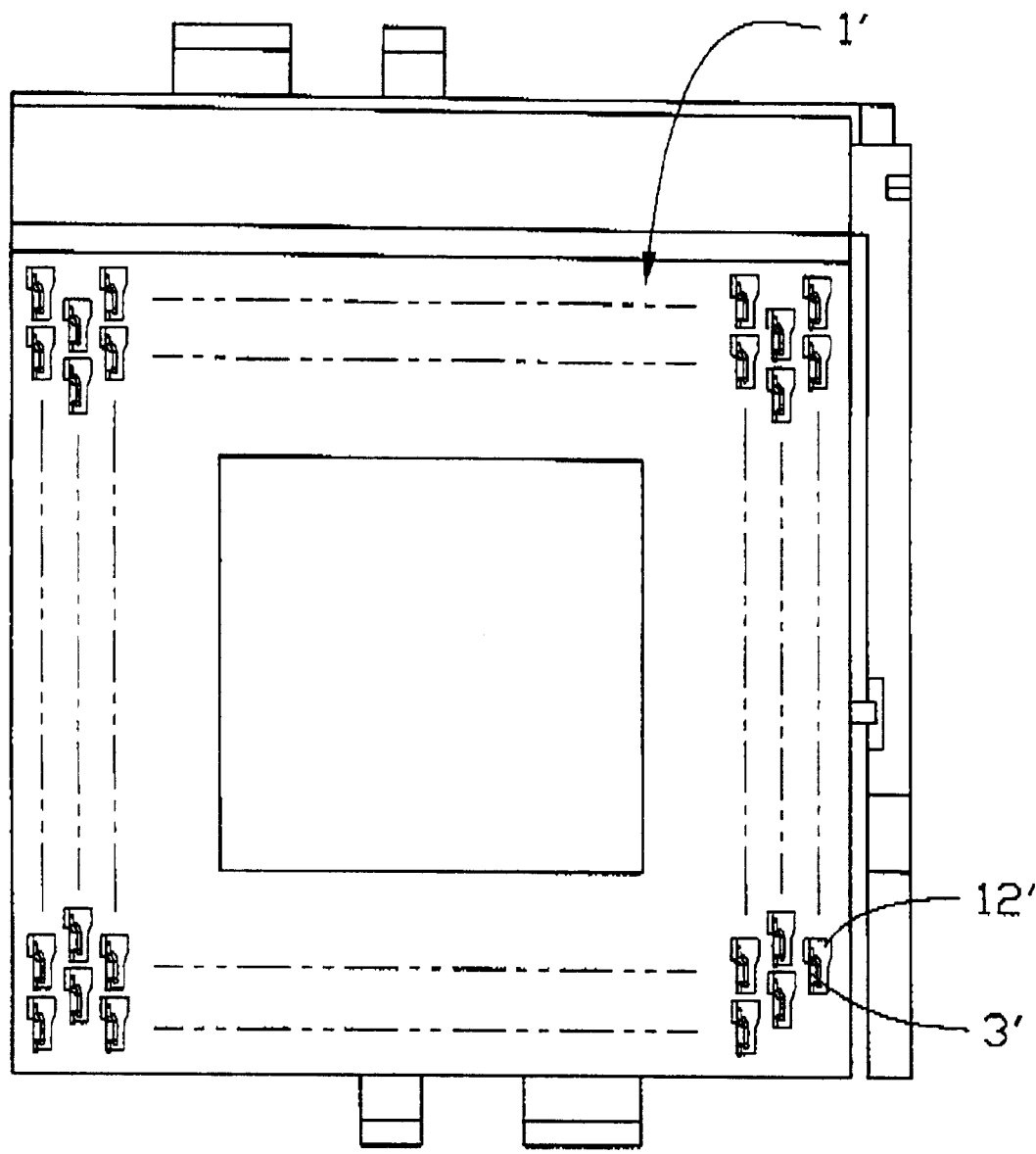
FIG. 2 is a elevation assembled view of FIG. 1.
Figure 3:
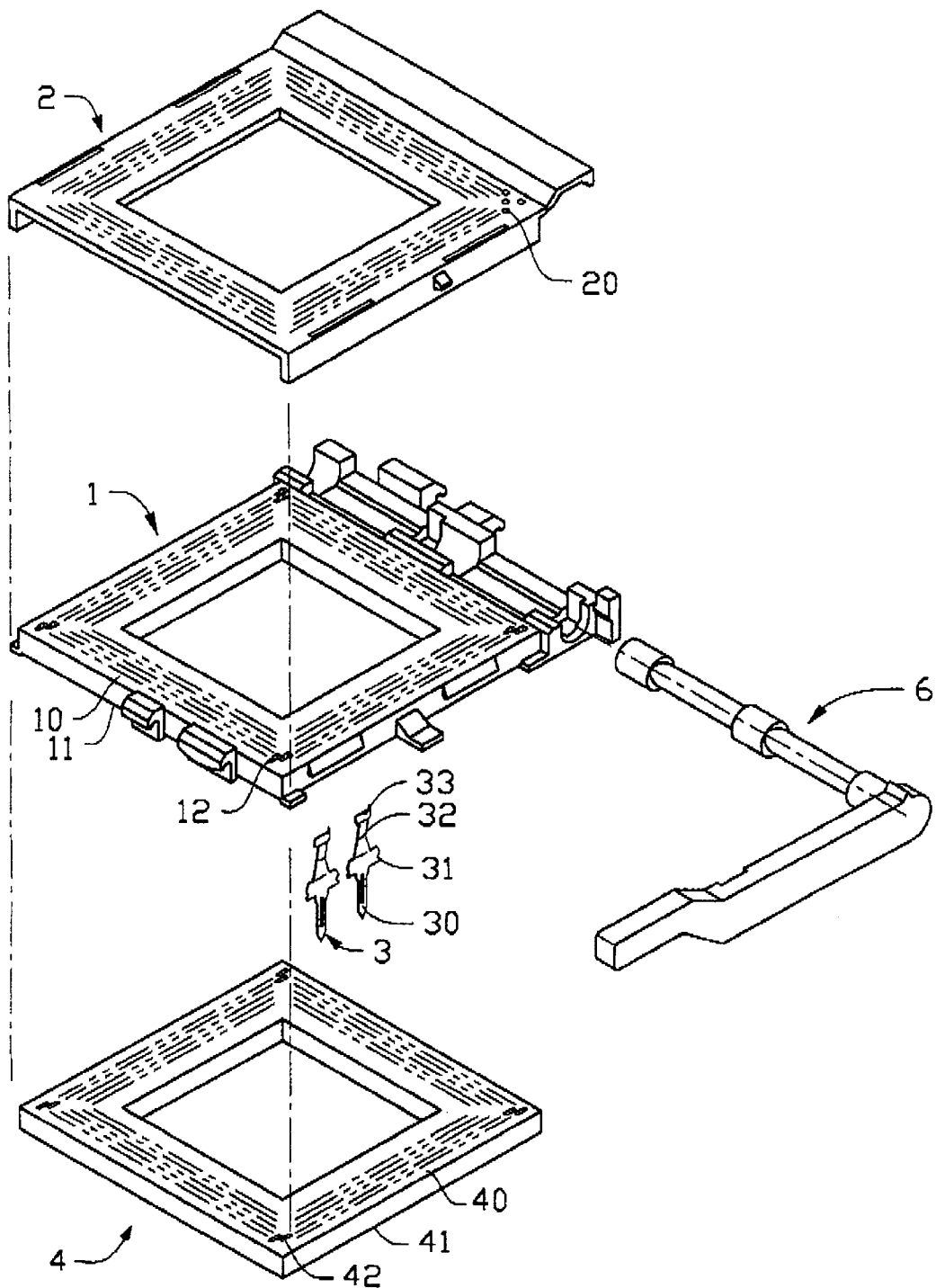
FIG. 3 is an exploded view of an electrical connector in accordance with the present invention in which the exemplary contacts are exaggerated in size for clarity purpose.

Referring to FIG. 3, an electrical connector in accordance with a preferred embodiment of the present invention comprises a dielectric base 1, a dielectric cover 2 mounted to the base 1, a plurality of contacts 3 received in the base 1, a positioning member in the form of a positioning board 4 and a cam driver 6 pivotally attached between the base 1 and the cover 2. The base 1 comprises a mating surface 10, a joining surface 11 and a plurality of engaging slots 12 defined between the mating surface 10 and the joining surface 11 for receiving the corresponding contacts 3 therein. The cover 2 defines a plurality of passageways 20 for receiving corresponding pins of a mating chip module (not shown). The cover 2 is driven by the cam driver 6 to slide along the mating surface 10 of the base 1 whereby the pins of the chip module electrically engage with the corresponding contacts 3.

Each contact 3 comprises a joining portion 30, an engaging portion 31, a resilient portion 32 and a contact portion 33. The engaging portion 31 of each contact 3 forms barbs (not shown) on opposite lateral edges thereof for securing the contact 3 within the corresponding engaging slot 12 of the base 1. The resilient portion 32 and the contact portion 33 of each contact 3 integrally deflect toward one lateral side relative to the engaging portion 31 and the joining portion 30, thereby facilitating electrical connection between the contact portions 33 and the corresponding pins of the chip module. The joining portion 30 of each contact 3 extends beyond the joining surface 11 of the base 1 and into the positioning board 4.

The base 1, the cover 2, the contacts 3 and the cam drive 6 can all be conventional designations according to practical requirements.

Figure 4:
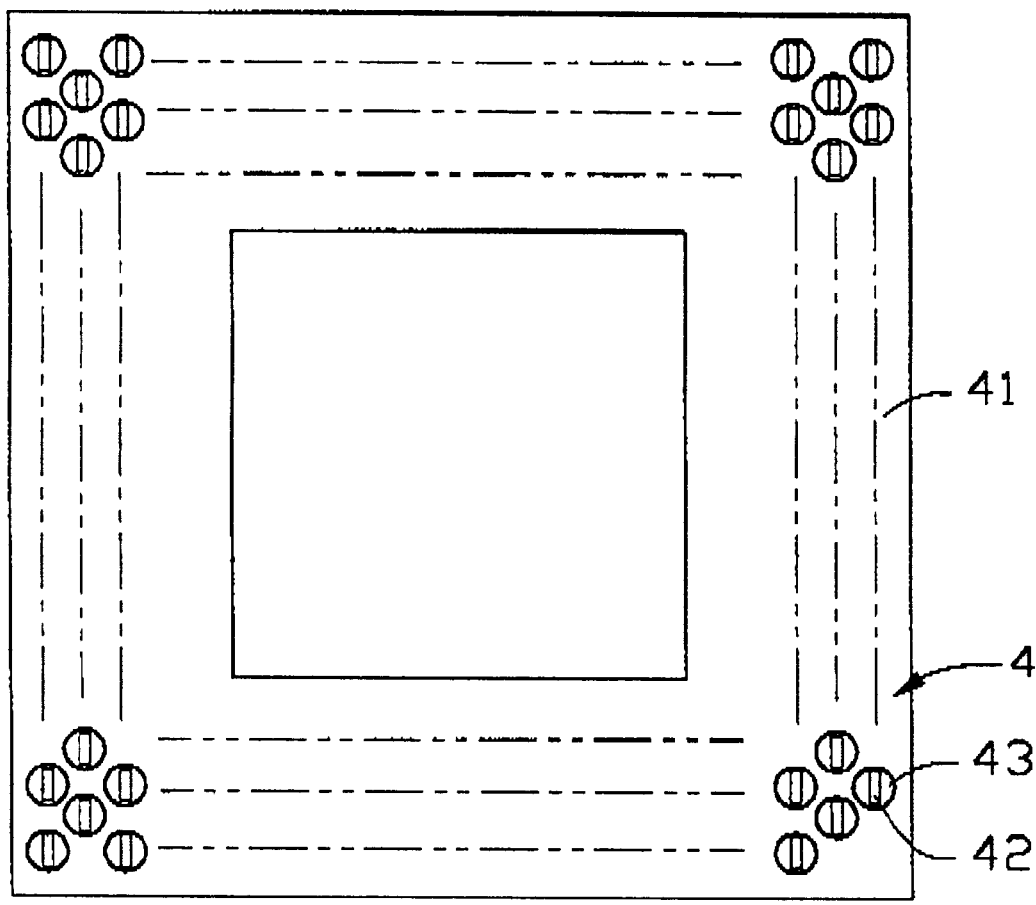
FIG. 4 is an elevation view of a positioning member in accordance with the present invention.
Figure 5:
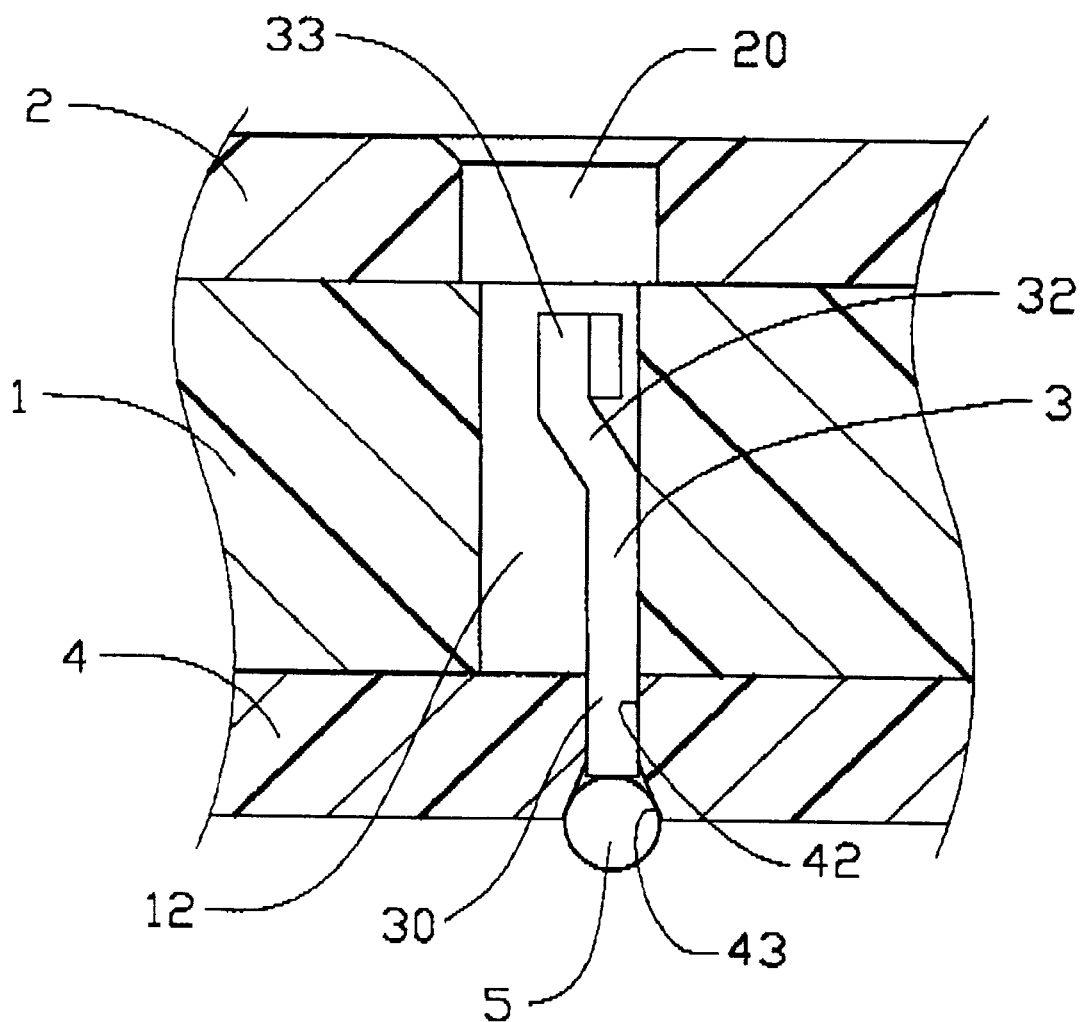
FIG. 5 is a partial, sectional view of the electrical connector of the present invention.

Also referring to FIGS. 4 and 5, the positioning board 4 comprises a top surface 40, a bottom surface 41 opposite the top surface 40, guiding means 42 adjacent to the top surface 40, and receiving means 43 adjacent to the bottom surface 41. The guiding means 42 is a plurality of guiding holes 42, while the receiving means is a plurality of conical recesses 43 joining the corresponding guiding holes 42. Both the guiding holes 42 and the receiving recesses 43 are defined between the top surface 40 and the bottom surface 41. The guiding holes 42 guide the joining portions 30 of the corresponding contacts 3 to electrically connect with a mating circuit board (not shown). Each guiding hole 42 has a configuration complying with the shape of the joining portions 30 of the contacts 3.

Since the guiding holes 42 snugly receive the corresponding joining portions 30 therein, molten solder is prevented from flowing into the engaging slots 12 of the base 1 thereby ensuring high quality signal transmission between the chip module and the mating circuit board. Each receiving recess 43 has a conical configuration and a wide face thereof is exposed to the bottom surface 41 of the positioning board 4 for receiving a solder ball 5 therein. An inner surface of each receiving recess 43 is copperized or galvanized for facilitating the positioning of the solder ball 5 therein. The joining portions 30 of the contacts 3 extend through the guiding holes 42 and into the corresponding receiving recesses 43 for being electrically welded to the solder ball 5 received therein.

In assembly, the contacts 3 are disposed in the corresponding engaging slots 12 of the base 1. The cover 2 and the cam driver 6 are fixed to the base 1 whereby the cam driver 6 can pivotally drive the cover 2 to slide along the mating surface 10 of the base 1. The positioning board 4 is mounted to the joining surface 11 of the base 1. The joining portions 30 of the contacts 3 extend beyond the joining surface 11 of the base 1 through the corresponding guiding holes 42 of the positioning board 4 and into the corresponding receiving recesses 43, but not beyond the bottom surface 41 of the positioning board 4.

Before the connector is soldered to a mating circuit board, a plurality of solder balls 5 are disposed in the corresponding receiving recesses 43 of the positioning board 4. The solder balls 5 are heated to become molten and surround the joining portions 30 of the corresponding contacts 3 thereby establishing electrical connection between the connector and the mating circuit board. After the pins of the chip module are inserted into corresponding passageways 20 of the cover 2, the cam driver 6 drives the cover 2 to slide along the mating surface 10 of the base 1 whereby the pins to of the chip module electrically engage the corresponding contacts 3 of the connector. Thus, the connector electrically connects the chip module to the mating circuit board.

The positioning board 4 can be made of the same dielectric material as the mating circuit board thereby eliminating different thermal expansion between top and bottom surfaces of the solder balls 5 due to a difference in coefficients of thermal expansion between the connector and the mating circuit board. Thus, proper signal transmission is facilitated.

The guiding holes 42 of the positioning board 4 snugly receive the joining portions 33 of the corresponding contacts 3 therein thereby effectively prevent molten solder from flowing into the corresponding engaging slots 12 of the base 1. Moreover, the receiving recesses 43 of the positioning board 4 have a conical configuration for accurately positioning the solder balls 5 therein. Therefore, the electrical connector in accordance with the present invention promotes clear and stable signal transmission therethrough.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for electrically connecting a chip module to a circuit board, comprising:

a dielectric base comprising a mating surface for supporting a chip module, a joining surface facing the circuit board and a plurality of engaging slots defined between the mating surface and the joining surface;

a plurality of contacts received in corresponding engaging slots of the dielectric base, each contact comprising a contact portion extending toward the mating surface of the dielectric base for electrically connecting with pins of a chip module and a joining portion extending beyond the joining surface of the dielectric base; and a positioning member attached to the joining surface of the dielectric base, the positioning member comprising guiding means for guiding the joining portions of the corresponding contacts thereinto and receiving means receiving and positioning corresponding solder balls therein;

wherein the guiding means comprises a plurality of guiding holes defined in a top surface of the positioning member for snugly receiving the joining portions of the corresponding contacts thereby preventing molten solder from flowing into the corresponding engaging slots of the base;

wherein the receiving means comprises a plurality of conical receiving recesses defined in a bottom surface of the positioning member for positioning the solder balls therein, each receiving recess communicating with the corresponding guiding hole thereby enabling the joining portions of the corresponding contacts to be welded with the corresponding solder balls;

further comprising a dielectric cover slidably mounted to the mating surface of the dielectric base and defining a plurality of passageways therein for receiving corresponding pins of the chip module;

wherein a cam driver is pivotally attached between the dielectric base and the dielectric cover for driving the dielectric cover to slide along the mating surface of the dielectric base whereby the pins of the chip module electrically contact the corresponding contacts of the dielectric base.

2. The electrical connector as claimed in claim 1, wherein inner surfaces of the receiving recesses of the positioning member are galvanized for facilitating the positioning of the solder balls therein.

3. The electrical connector as claimed in claim 1, wherein inner surfaces of the receiving recesses of the positioning member are copperized for facilitating the positioning of the solder balls therein.

4. The electrical connector as claimed in claim 1, wherein the positioning member is made of the same dielectric material as the mating circuit board thereby eliminating different thermal expansion between top and bottom surfaces of the solder balls due to a difference in coefficients of thermal expansion between the electrical connector and the mating circuit board.

* * * * *